US006226318B1

United States Patent
Citta et al.

(10) Patent No.: US 6,226,318 B1
(45) Date of Patent: May 1, 2001

(54) DETECTION OF CODE VECTORS IN SINGLE FREQUENCY, MULTIPLE TRANSMITTER NETWORKS

(75) Inventors: Richard W. Citta, Oak Park; Stephen M. Dicke, Chicago, both of IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 09/052,501

(22) Filed: Mar. 31, 1998

(51) Int. Cl.[7] ............................................... H04L 27/30
(52) U.S. Cl. ........................ 375/149; 370/209; 375/340; 375/341
(58) Field of Search ................................. 375/340, 147, 375/150, 142, 136, 152, 143, 316, 341, 324, 149; 370/206, 209, 320, 335, 342; 704/222, 203, 263; 708/410, 403, 400, 402

(56) References Cited

U.S. PATENT DOCUMENTS

| 5,751,856 | * | 5/1998 | Hirabayashi | 382/232 |
| 5,949,814 | * | 9/1999 | Odenwalder et al. | 375/200 |
| 5,966,370 | * | 10/1999 | Gunzelmann | 370/320 |
| 5,987,076 | * | 11/1999 | Zehavi et al. | 375/340 |
| 5,991,627 | * | 11/1999 | Honkasalo et al. | 455/437 |
| 6,009,552 | * | 12/1999 | Ariel et al. | 714/780 |
| 6,035,007 | * | 3/2000 | Khayrallah et al. | 375/341 |

FOREIGN PATENT DOCUMENTS

| 0 565 504 | 10/1993 | (EP) | H04J/13/00 |
| 0 565 506 | 10/1993 | (EP) | H04J/13/00 |
| WO 95/22859 | 8/1995 | (WO) | H04B/1/707 |

OTHER PUBLICATIONS

International Search Report, dated Mar. 11, 1999, Application No. PCT/US98/24637.

* cited by examiner

*Primary Examiner*—Chi Pham
*Assistant Examiner*—Emmanuel Bayard

(57) ABSTRACT

A receiver receives a signal which contains a code vector. The code vector is a member of a predetermined set of code vectors. The code vectors may be Kerdock code vectors. The receiver produces a transform, such as a Walsh transform, of the received signal. The transform contains a coefficient corresponding to each of at least some of the code vectors of the predetermined set of code vectors. The receiver determines data elements transmitted as the received code vector based upon the magnitudes of the coefficients of the transform. When plural code vectors are transmitted, the receiver determines data elements transmitted as a first code vector based upon the magnitudes of the coefficients of the transform, subtracts the first code vector from the received signal, produces a new transform of the subtraction results, and determines data elements transmitted as another code vector based upon the magnitudes of the coefficients of the new transform, and so on.

67 Claims, 8 Drawing Sheets

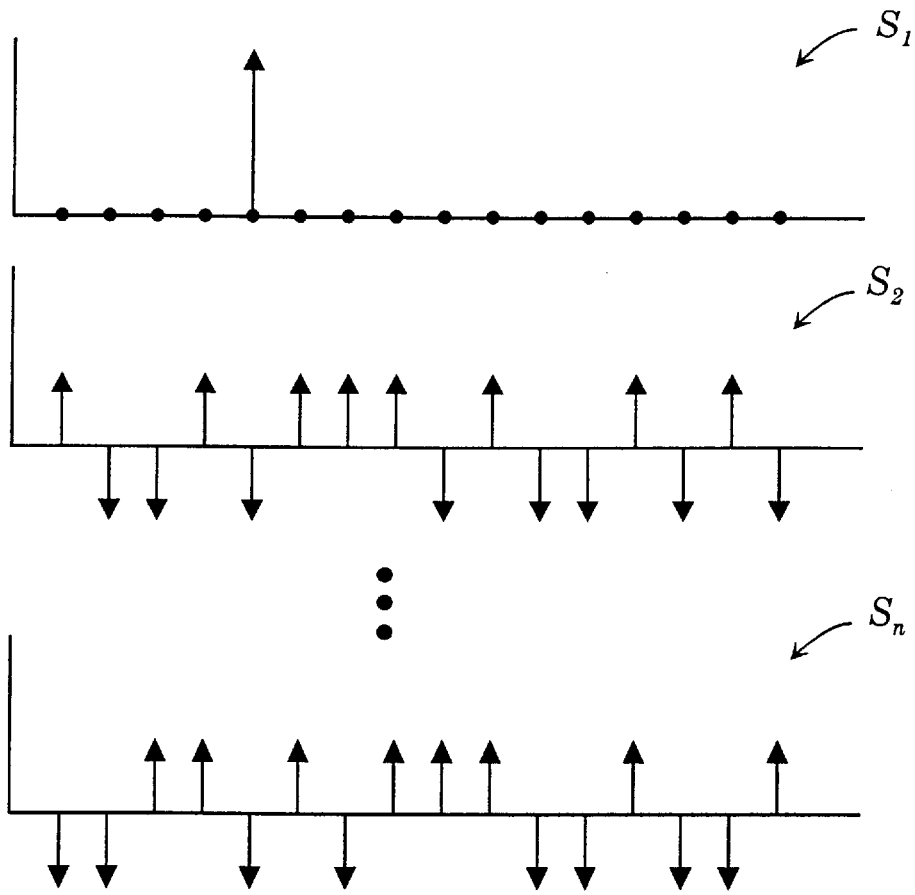
*Figure 9*
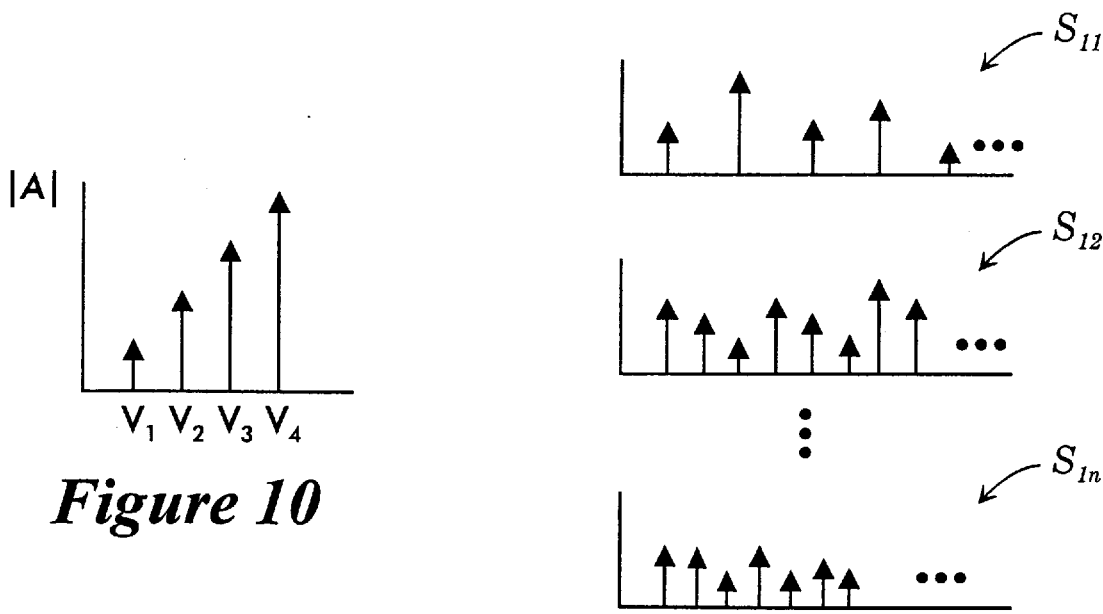
*Figure 10*
*Figure 11*

DETECTION OF CODE VECTORS IN SINGLE FREQUENCY, MULTIPLE TRANSMITTER NETWORKS

TECHNICAL FIELD OF THE INVENTION

The present invention relates to an arrangement for detecting code vectors which are transmitted in a single frequency, multiple transmitter network.

BACKGROUND OF THE INVENTION

Data communication systems, such as cable systems, typically include a head end which transmits data to a plurality of subscribers over a cable system. Typically, the cable system is at least partially buried and has a cable main trunk carrying data directly from the head end, cable branch lines branching out of the main trunk, and cable subscriber lines carrying data between the cable branch lines and the subscribers. Considerable labor is required in running subscriber lines from cable branch lines to subscribers, particularly for those subscribers who are located at distances such as 1,000 feet or more from the cable branch lines.

Instead of running subscriber lines from cable branch lines to subscribers, transmitters could be located periodically along the cable branch lines in order to transmit data over the air between cable branch lines and subscribers. Thus, the substantial labor which is necessary to connect a subscriber to a cable branch line is materially reduced. However, care must be exercised in locating such transmitters. For example, if a subscriber is covered by only one transmitter, there may be areas within the premises of the subscriber where reception is poor.

The possibility of poor reception can be lessened by locating the transmitters sufficiently close to one another that the premises of each subscriber is covered by two or more transmitters. Unfortunately, because each transmitter operates at the same carrier frequency, and because of the variable distances between a subscriber's premises and the transmitters that cover the subscriber's premises, the same data may arrive at a reception site within a subscribers premises at different times and with different phases. As a result, interference, referred to herein as ghosting, is produced.

If signal amplitude versus frequency of the received signal at a reception site in a subscriber's premises covered by two transmitters is graphed, an interference pattern can result. In the case where the reception site is located at an equal distance from both transmitters, the interference pattern has the shape shown in FIG. 1. This interference pattern may be sometimes referred as 100% ghosting. In this interference pattern, the signal amplitude of the received signal is characterized by periodic, sharply defined nulls at which the signal is substantially undetectable, particularly in the presence of noise. That is, noise in the channel establishes a signal detection threshold above the horizontal axis as viewed in FIG. 1, such that any frequency components of the transmitted signal near or at the nulls will be difficult or impossible to detect because the signal to noise ratio at these points is too low. Moreover, when the received signal is processed through an equalizer, the signal to noise ratio can worsen, making signal detection even more difficult.

It is known how to adequately receive signals in the presence of white noise. For example, trellis encoding and Viterbi decoding may be used to encode and decode transmitted data adequately when white noise is present, because this type of coding and decoding performs well under white noise conditions. Unfortunately, trellis encoding and Viterbi decoding do not work particularly well in the presence of non-randomly distributed noise, such as may be present in an environment experiencing 100% ghosting.

The present invention is directed to a coding and decoding arrangement which is particularly useful in a single frequency, multi-transmitter network in which 100% ghosting is present.

SUMMARY OF THE INVENTION

In accordance with the present invention, a receiver receives a signal containing at least one of a plurality of code vectors. A transform is applied to the signal producing a plurality of multi-coefficient spectra. Data elements are derived from the multi-coefficient spectra. More particularly, the data elements are derived from the coefficient in the multi-coefficient spectra having the largest magnitude.

In a more detailed aspect of the present invention, the received signal is multiplied by a plurality of coset leaders to produce a plurality of multiplication results. The coset leaders correspond to cosets into which the code vectors of the plurality of code vectors may be divided. The resulting multi-coefficient spectra are analyzed in order to derive the data elements corresponding to the at least one code vector.

In a further more detailed aspect of the present invention, the received signal may contain at least first and second code vectors. Data elements are determined corresponding to one of the first and second code vectors based upon the magnitudes of the coefficients of the multi-coefficient spectra. This one code vector is subtracted from the received signal to produce a subtraction result. Data elements are then determined corresponding to the other of the first and second code vectors based upon the magnitudes of the coefficients of multi-coefficient spectra derived from the subtraction result.

In a still further more detailed aspect of the present invention, the received signal may contain a plurality of transmitted code vectors. A received signal transform of the received signal is produced such that the received signal transform contains a coefficient for each of at least some of the code vectors of the predetermined set of code vectors. Data elements are determined corresponding to one code vector from the coefficient of the received signal transform having the largest magnitude. This code vector is subtracted from the received signal to produce a subtraction result. A subtraction result transform is produced such that the subtraction result transform contains a coefficient for each of at least some of the code vectors of the predetermined set of code vectors. Data elements are determined corresponding to another code vector from the coefficient of the subtraction result transform having the largest magnitude.

In yet a further more detailed aspect of the present invention, a received signal contains a plurality of code vectors which belong to a predetermined set of code vectors. The code vectors in the predetermined set of code vectors are divided into cosets, and the cosets are arranged into groups of cosets. Each code vector contained in the received signal belongs to a corresponding group of cosets. A window is applied to a first subset of the cosets. The received signal is multiplied by a coset leader corresponding to each coset within the window in order to produce a received signal coefficient spectrum for each coset within the window. Data elements are determined from a received signal coefficient that corresponds to a coset within the window and that has the largest magnitude. The code vector corresponding to these data elements is subtracted from the received signal to produce a subtraction result. The window is slid to cover a second subset of the cosets. The subtraction result is multiplied by the coset leaders corresponding to the cosets within the window in order to produce a subtraction result coefficient spectrum for each coset within the window. Data elements are determined from a subtraction result coefficient that corresponds to a coset within the window and that has the largest magnitude.

BRIEF DESCRIPTION OF THE DRAWINGS

These and other features and advantages of the present invention will become more apparent from a detailed consideration of the invention when taken in conjunction with the drawings in which:

FIG. 9 illustrates an exemplary set of Walsh spectra determined by the decoder of FIG. 8;

FIG. 10 illustrates a set of weighted code vectors which can be transmitted by the transmitter of FIG. 4;

FIG. 11 illustrates an exemplary set of Walsh transform spectra which are determined by the Walsh transform arrangement of FIG. 8 and which correspond to the weighted code vectors illustrated in FIG. 10;

DETAILED DESCRIPTION

Figure 2:
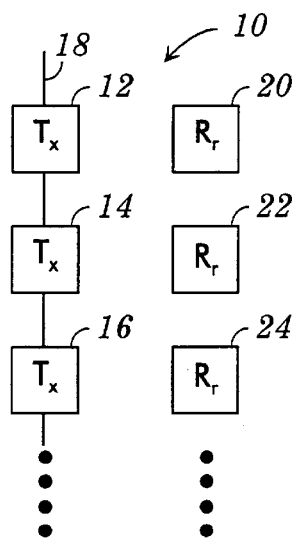
FIG. 2 is a generalized block diagram of a single frequency, multiple transmitter network as an example of a network in which the present invention can be practiced.

A single frequency, multiple transmitter network 10, in which the present invention may be used, is illustrated in FIG. 2. The single frequency, multiple transmitter network 10 includes transmitters 12, 14, 16, . . . connected together by a cable or optical fiber system 18. It should be understood that the cable or optical fiber system 18 may comprise any number of lines, such as cable trunk lines and cable branch lines, connecting the transmitters 12, 14, 16, . . . in series, parallel, and/or other configuration. The transmitters 12, 14, 16, . . . transmit signals to receivers 20, 22, 24, . . . Although three receivers 20, 22, and 24 are shown in FIG. 2 being in close proximity to three transmitters 12, 14, and 16, it should be understood that each receiver 20, 22, 24, . . . can receive signals from one, two, three, or more of the transmitters 12, 14, 16, . . . .

Figure 1:
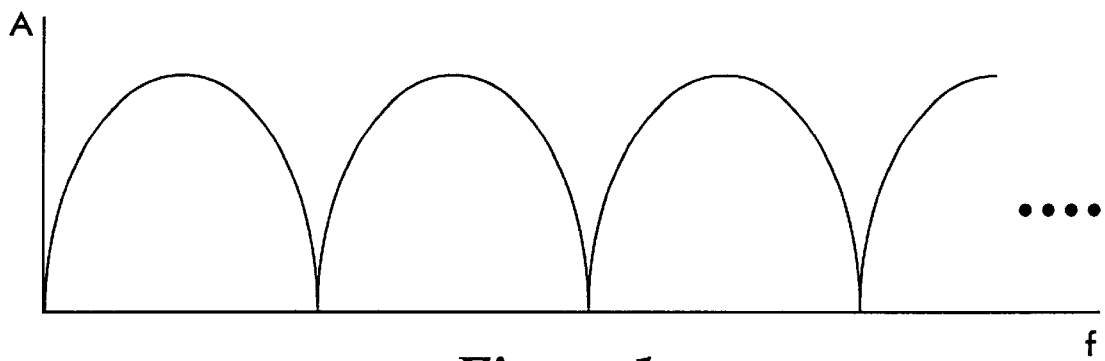
FIG. 1 is a diagram showing an interference pattern which is likely to result at a point that is equidistant from plural transmitters transmitting over a single frequency to a receiver.
Figure 3:
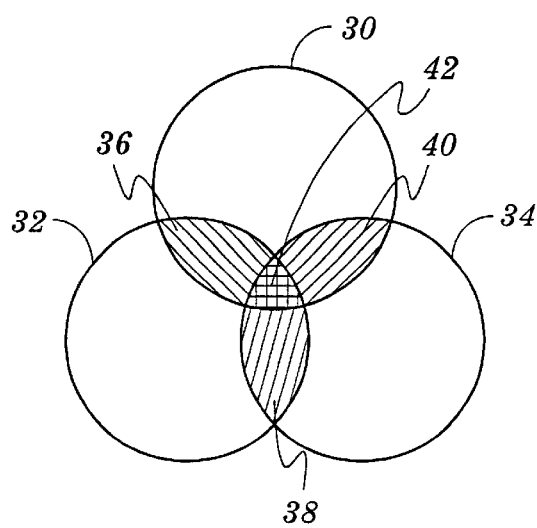
FIG. 3 illustrates an exemplary signal coverage of the single frequency, multiple transmitter network of FIG. 2.

For example, as shown in FIG. 3, a first of the transmitters 12, 14, 16, . . . may be sited to cover a geographic area 30, a second of the transmitters 12, 14, 16, . . . may be sited to cover a geographic area 32, and a third of the transmitters 12, 14, 16, . . . may be sited to cover a geographic area 34. The geographic areas 30 and 32 overlap at an overlap area 36, the geographic areas 32 and 34 overlap at an overlap area 38, the geographic areas 30 and 34 overlap at an overlap area 40, and all three geographic areas 30, 32, and 34 overlap at an overlap area 42. If one of the receivers 20, 22, 24, . . . is positioned in the overlap area 36, 38, or 40, it receives signals from two transmitters and is likely to be subject to an interference pattern similar to that shown in FIG. 1. If one of the receivers 20, 22, 24, . . . is located in the overlap area 42, the interference pattern is likely to be different than, but still similar to, that shown in FIG. 1. The present invention operates well in any of the area 30, 32, and 34, including the overlap areas 36, 38, 40, and 42.

Figure 4:
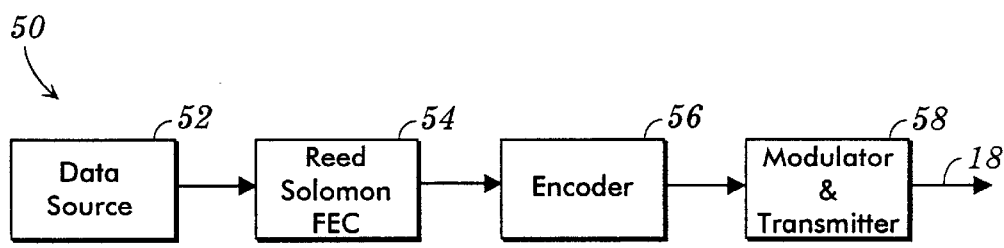
FIG. 4 illustrates a head end transmitter, including an encoder, which can be used to transmit code vectors to the single frequency, multiple transmitter network of FIG. 2.

A representative head end transmitter 50 is shown in FIG. 4 and supplies the cable or optical fiber system 18 with the data to be re-transmitted to the receivers 20, 22, 24, . . . by the transmitters 12, 14, 16, . . . Thus, each of the transmitters 12, 14, 16, . . . connected in the cable or optical fiber system 18 receives the data from the head end transmitter 50 and re-transmits that data to one or more of the receivers 20, 22, 24 . . . .

The head end transmitter 50 includes a data source 52 which provides the data which is to be supplied to the cable or optical fiber system 18. The data provided by the data source 52 is supplied to a Reed Solomon forward error correction encoder 54, and the output of the Reed Solomon forward error correction encoder 54 is then encoded by an encoder 56. The error corrected and encoded data is modulated and transmitted by a modulator/transmitter 58.

The data provided by the data source 52 and the Reed Solomon forward error correction encoder 54 may be encoded by the encoder 56 using a predetermined set of code vectors. These code vectors are preferably Kerdock code vectors, and the code vectors have a length L defined as the number of bits per code vector. For purposes of describing the present invention, it is assumed that a code vector may have a length of sixteen indicating that there are sixteen bits in each code vector. However, it should be understood that code vectors having different lengths may be used with respect to the present invention. For example, code vectors having a length of 64, 256, or more may be used with respect to the present invention.

It is known that there are 256 Kerdock code vectors when the code vectors have a length of sixteen. If one of these 256 code vectors is properly chosen as a reference code vector, then there are 112 code vectors which have a distance D of six from the reference code vector, there are 30 code vectors which have a distance of eight from the reference code vector, there are 112 code vectors which have a distance of ten from the reference code vector, and there is one code vector which has a distance of sixteen from the reference code vector. The code vector which has a distance of sixteen from the reference code vector is the complement of the reference code vector. Distance is defined here as the number of bits which can be changed in one code vector before that code vector equals another code vector.

This reference code vector, the 30 code vectors which have a distance of eight from this reference code vector, and the complement (i.e., negative) of this reference code vector may be selected as a coset, and the reference code vector may be designated as the coset leader of the coset. Each code vector of these 32 code vectors has a complement in the coset. Accordingly, a coset contains first and second groups of code vectors, where each group contains sixteen code vectors, and where each code vector in the first group has a complement in the second group. Therefore, as will be apparent from the discussion below, it is useful to envision a coset as containing sixteen code vectors, where each code vector can be either positive or negative.

The 256 Kerdock code vectors may be similarly divided into seven more cosets, each having a coset leader, so that there are a total of eight cosets.

A code vector may be transmitted so that it represents a number of data elements. A data element may be a bit, symbol, or other unit of information. If a single code vector is transmitted at a time, three data elements may be used to define which of the eight cosets contains the code vector to be transmitted, four data elements may be used to define the code vector to be transmitted (not including its polarity), and one data element may be used to define the polarity of the transmitted code vector (i.e., whether the code vector or its complement is to be transmitted). This code vector is then transmitted for, and designates, its corresponding eight data elements.

Thus, when one code vector is transmitted at a time by the transmitter 50, and if the transmitted code vector has a length of sixteen, the rate of the system is defined as (number of data elements)/L or $8/16$ or $1/2$.

This rate can be increased by transmitting more code vectors at a time. For example, if the cosets are divided into two groups having four cosets per group such that a first code vector of the first group and a second code vector of the second group are simultaneously transmitted, fourteen data elements may be encoded as these two code vectors. In this case, two data elements define which of four cosets in the first group of cosets contains the first code vector to be transmitted, four data elements define the first code vector to be transmitted (not including its polarity) from the first group, and one data element defines the polarity of the transmitted first code vector (i.e., whether the code vector or its complement is to be transmitted). This first code vector is then transmitted for, and designates, its corresponding seven data elements. Similarly, the second code vector is transmitted with the first code vector and designates its corresponding seven data elements.

Thus, when two code vectors are simultaneously transmitted by the transmitter 50, and if the transmitted code vectors have lengths of sixteen, the rate of the system is defined as $14/16$ or $7/8$.

As another example, if the cosets are divided into four groups having two cosets per group such that four code vectors, one from each of the four groups, are simultaneously transmitted, twenty-four data elements may be encoded as these four code vectors. In this case, one data element defines which of two cosets in the first group of cosets contains the first code vector to be transmitted, four data elements define the first code vector to be transmitted (not including its polarity) from this first group, and one data element defines the polarity of the transmitted first code vector (i.e., whether the code vector or its complement is to be transmitted). This first code vector is then transmitted for, and designates, its corresponding six data elements. Similarly, the second, third, and fourth code vectors are transmitted with the first code vector and designate their corresponding six data elements.

Thus, when four code vectors are simultaneously transmitted by the transmitter 50, and if the transmitted code vectors have lengths of sixteen, the rate of the system is defined as $24/16$ or $3/2$.

Figure 5:
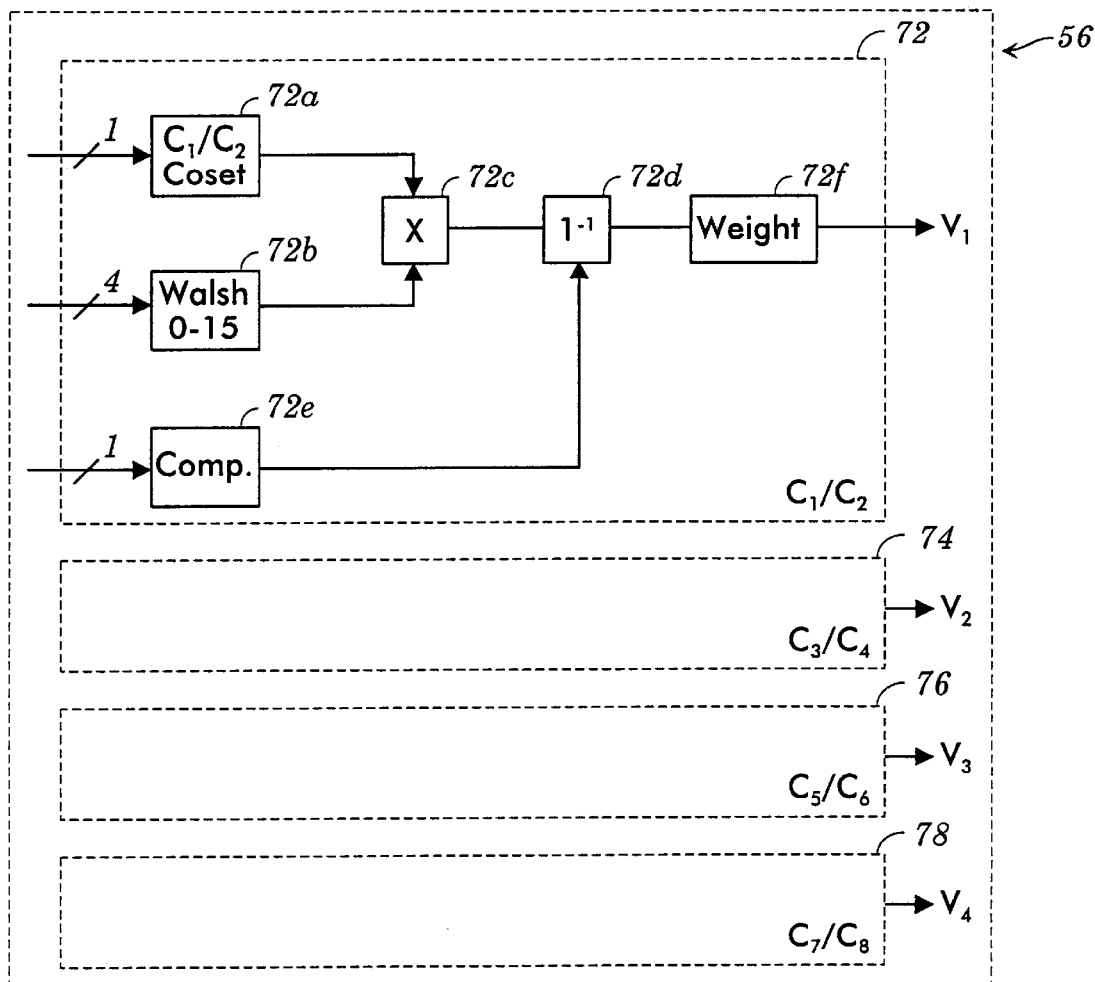
FIGS. 5 and 6 illustrate an exemplary embodiment of a portion of the encoder of FIG. 4.

The encoder 56 is shown in part in FIG. 5. The part of the encoder 56 shown in FIG. 5 is that part which converts data elements to code vectors for transmission by the transmitter 50. The encoder 56 includes code vector generators 72, 74, 76, and 78 for the example where four code vectors, each having a length of sixteen, are simultaneously transmitted. However, it should be understood from the discussion above that the number of code vectors that can be simultaneously transmitted depends upon the length of the code vectors.

The code vector generator 72 includes a coset leader selector 72a which selects the coset leader that corresponds to the one of two cosets $C_1$ or $C_2$ containing the code vector $V_1$ to be transmitted. The coset leader selector 72a responds to one of the six data elements to be encoded as the code vector $V_1$ in order to make this selection. A Walsh function selector 72b selects a Walsh function according to another four of the six data elements to be encoded as the code vector $V_1$. This Walsh function corresponds to the specific code vector $V_1$ to be transmitted. A multiplier 72c multiplies the selected coset leader and the selected Walsh function, and the result of this multiplication is complemented or not at a block 72d as determined by a complement selector 72e which responds to the last of the six data elements to be encoded as the code vector $V_1$. The output of the block 72d is the code vector $V_1$. If desired, this code vector $V_1$ can be weighted at a block 72f, as described below.

The code vector generators 74, 76, and 78 operate in a similar manner except that the code vector generator 74 generates a code vector $V_2$ selected from cosets $C_3$ or $C_4$, the code vector generator 76 generates a code vector $V_3$ selected from cosets $C_5$ or $C_6$, and the code vector generator 78 generates a code vector $V_4$ selected from cosets $C_7$ or $C_8$.

Figure 6:
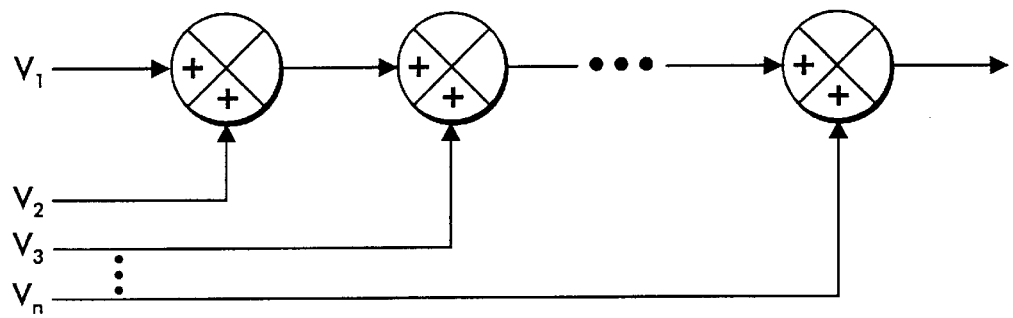

As shown in FIG. 6, the Kerdock code vectors $V_1$, $V_2$, $V_3$, and $V_4$ are added bit wise, and the result is supplied to the modulator/transmitter 58.

Figure 7:
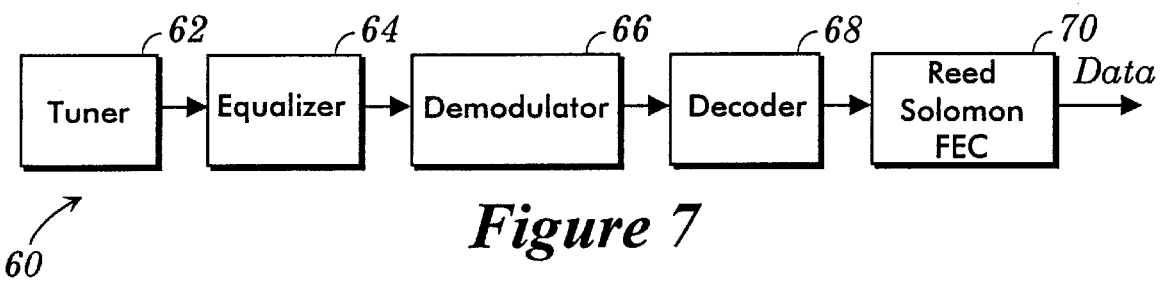
FIG. 7 illustrates a receiver, including a decoder, which can be used in the single frequency, multiple transmitter network of FIG. 2.

The signal transmitted by one or more of the transmitters 12, 14, 16, . . . may be received by a receiver 60 shown in FIG. 7. The receiver 60 includes a tuner 62 for tuning to the carrier used by the modulator/transmitter 58, an equalizer 64 for reducing intersymbol interference, a demodulator 66 for demodulating the received signal, a decoder 68 for decoding the code vectors in the received signal back to the data elements provided by the Reed Solomon forward error correction encoder 54, and a Reed Solomon forward error correction circuit 70.

Figure 8:
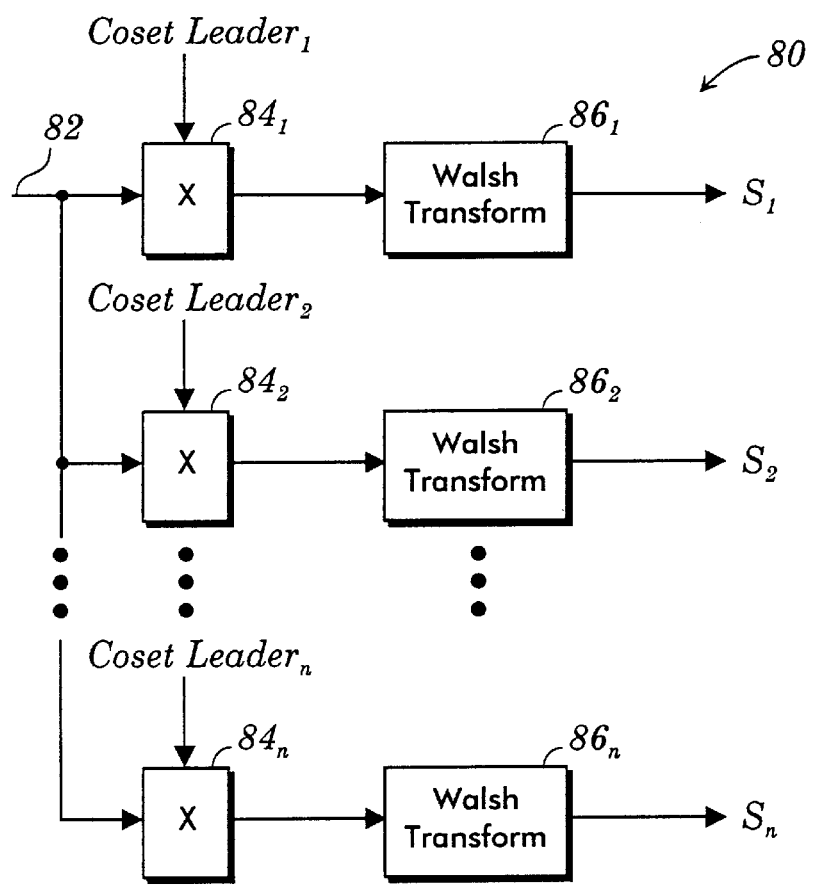
FIG. 8 illustrates a Walsh transform arrangement that may be implemented by the decoder of FIG. 7.

In order to recover the data elements that were used to select the transmitted code vectors, the decoder 68 may perform a Walsh transform according to an arrangement 80, which is shown in FIG. 8, on a received signal 82. The received signal 82 is multiplied in multipliers $84_1$, $84_2$ . . . $84_n$ by coset leader$_1$, coset leader$_2$, . . . coset leader$_n$. In the case of a code vector set having eight cosets as described above, n is eight so that there are eight multipliers which multiply the received signal 82 by eight corresponding coset leaders. Although these coset leaders may be any code vector in the corresponding coset, the coset leaders may be the reference code vectors which are used to select the code vectors for each coset, as described above. Thus, when eight cosets are used, $coset leader_1$ corresponds to $coset_1$, $coset leader_2$ corresponds to $coset_2$, . . . and $coset leader_8$ corresponds to $coset_8$.

The multiplication result from each multiplier $84_1$–$84_n$ is processed by a corresponding Walsh transform $86_1$, $86_2$ . . . $86_n$. The Walsh transforms $86_1$, $86_2$ . . . $86_n$, which are performed on the corresponding multiplication results from the multipliers $84_1$, $84_2$, . . . $84_n$, generate corresponding Walsh transform spectra $S_1$, $S_2$, . . . $S_n$. The Walsh transform spectrum $S_1$ corresponds to $coset_1$, the Walsh transform spectrum $S_2$ corresponds to $coset_2$, . . . , and the Walsh transform spectrum $S_n$ corresponds to $coset_n$. Each of the Walsh transform spectra $S_1$, $S_2$, . . . $S_n$ includes sixteen coefficients, and each coefficient may be either positive or negative. Thus, each spectrum has a coefficient for each of the 32 code vectors of its corresponding coset.

Examples of the Walsh transform spectra $S_1$, $S_2$, . . . $S_n$ are shown in FIG. 9 for the case where only one Kerdock code vector is transmitted at a time. Only sixteen positions are shown in the Walsh transform spectra $S_1$, $S_2$, . . . $S_n$ of FIG. 9 because, as discussed above, the coefficient at any one position may be positive or negative corresponding to a positive or negative code vector (i.e., a code vector or its complement). The magnitudes and the polarities of the exemplary coefficients shown in FIG. 9 are representative and arbitrary, it being understood that the magnitudes and the polarities of the actual coefficients depend upon factors such as noise and the polarity of the transmitted code vector.

The example of FIG. 9 assumes that only one code vector was transmitted at a time. Moreover, although the transmitted code vector can be in any of the eight cosets, it is assumed for purposes of the example shown in FIG. 9 that the code vector in the received signal 82 is in the $coset_1$ corresponding to the $coset leader_1$. Accordingly, the coefficient in the Walsh transform spectrum $S_1$ corresponding to the transmitted code vector has a magnitude (such as sixteen) which is largest of the magnitudes of the coefficients corresponding to all of the other possible code vectors.

More specifically, each of the coefficients in the Walsh transform spectrum $S_1$ corresponding to code vectors of the $coset_1$ other than the transmitted code vector has a magnitude of substantially zero, and each of the coefficients in the Walsh transform spectra $S_2$–$S_n$ corresponding to code vectors of $coset_2$–$coset_n$ has a relatively small non-zero magnitude (such as four). Thus, the coefficient corresponding to the transmitted code vector is easily discernible. The Walsh transform spectrum containing the coefficient having the largest magnitude indicates the thirty-two code vector coset to which the transmitted code vector belongs, and the position and polarity of the coefficient having the largest magnitude in its Walsh transform spectrum determines which of the thirty-two code vectors in this coset is the transmitted code vector. This information is used to recover the data elements that were used to select the transmitted code vector.

Specifically, in the case where n=8, and where only one code vector having a length of sixteen is transmitted at a time so that only one coefficient in the Walsh spectra of FIG. 9 has the largest magnitude, (i) the coset corresponding to the Walsh spectrum containing the largest coefficient defines the three data elements that were used to specify the coset from which the transmitted code vector was selected, (ii) the position of the largest coefficient in the Walsh spectrum containing the largest coefficient defines the four data elements that were used to select the Walsh function corresponding to the transmitted code vector, and (iii) the polarity of the largest coefficient defines the one data element that was used to select the polarity of the transmitted code vector.

In the case where n=8, and where four code vectors each having a length of sixteen are transmitted simultaneously, the corresponding six data elements are recovered from each transmitted code vector in a similar fashion. That is, one coefficient in the first two Walsh spectra corresponding to the first two cosets, i.e., $coset_1$ and $coset_2$, has the largest magnitude. The coset corresponding to the Walsh spectrum containing this coefficient defines the one data element that was used to specify the coset from which the first transmitted code vector was selected. The position of this coefficient in its Walsh spectrum defines the four data elements that were used to select the Walsh function corresponding to the first transmitted code vector. The polarity of this coefficient defines the one data element that was used to select the polarity of the first transmitted code vector.

Next, one coefficient in the next two Walsh spectra corresponding to the next two cosets, i.e., $coset_3$ and $coset_4$, has the largest magnitude. The coset corresponding to the Walsh spectrum containing this coefficient defines the one data element that was used to specify the coset from which the second transmitted code vector was selected. The position of this coefficient in its Walsh spectrum defines the four data elements that were used to select the Walsh function corresponding to the second transmitted code vector. The polarity of this coefficient defines the one data element that was used to select the polarity of the second transmitted code vector. The data elements transmitted by way of the third and fourth code vectors are recovered in a similar manner.

The Walsh transform spectra $S_1$, $S_2$, . . . $S_n$ shown in FIG. 9 assume that the received signal was not affected by white noise along its transmission path. If the received signal had been affected by white noise along its transmission path, the Walsh transform spectra $S_1$, $S_2$, . . . $S_n$ would have noise around each of the horizontal axes. However, this noise is small compared to the magnitude of the coefficient corresponding to the transmitted code vector so that the transmitted code vector can be easily detected in the presence of white noise.

Cross talk, however, can significantly affect simultaneously transmitted code vectors. Because of cross talk between simultaneously transmitted code vectors having substantially equal transmitted power, the length of the code vectors places a limit on the number of code vectors that can be simultaneously transmitted. For example, if the length of each code vector is sixteen, only two code vectors having substantially equal transmitted powers can be transmitted at a time.

That is, if one code vector is transmitted, if a length of sixteen is used for the transmitted code vector, and if a Walsh transform is performed on the received signal using eight coset leaders of the eight possible cosets, the coefficient, which corresponds to the transmitted code vector and which is in the Walsh transform spectrum of the coset containing the transmitted code vector, has a relatively large magnitude. Each of the other coefficients in the Walsh transform spectrum corresponding to the coset containing the transmitted code vector has a magnitude of near zero, and each of the coefficients in the other Walsh transform spectra has a relatively small, non-zero magnitude.

However, when two such code vectors are transmitted at a time (i.e., transmitted substantially simultaneously), there is cross talk between the two code vectors such that the coefficient corresponding to either one of the transmitted vectors can have an amplitude, for example, of 16±4, the other coefficients of the Walsh transform spectrum containing the coefficient corresponding to that transmitted code vector can have magnitudes, for example, of 0±4, and the coefficients of the other Walsh transform spectra can have magnitudes of 4±4. The worst case difference between the magnitudes of the coefficients corresponding to the transmitted code vectors and the other coefficients in the Walsh transform spectra is (16−4)−(4+4) or 4. Thus, the transmitted code vectors are still reliably detectable.

However, when three code vectors are transmitted at a time, the worst case difference between the magnitude of the coefficient corresponding to a transmitted code vector and the other coefficients in the Walsh transform spectra is (16−4−4)−(4+4+4) or −4. In this case, a code vector other than the transmitted code vector may be erroneously decoded.

By increasing the length of the code vector to 64, more code vectors can be transmitted simultaneously. By increasing the length of the code vector beyond 64, the maximum number of code vectors that can be simultaneously transmitted is increased even more.

The number of code vectors that can be transmitted at a time can also be increased by increasing the confidence that one of the code vectors can be properly decoded, by decoding the code vector associated with the highest confidence first, by subtracting the code vector decoded first from the received signal so as to eliminate the cross talk contributed by the first code vector, by decoding another of the code vector, by subtracting the code vector decoded second from the received signal so as to eliminate the cross talk contributed by the code vector decoded second, and so on.

Confidence of properly decoding plural code vectors which are simultaneously transmitted can be increased by weighting the transmitted power of each code vector by a different amount. For example, the absolute value of four differently weighted code vectors $V_1$–$V_4$, which are to be added and transmitted simultaneously, are shown in FIG. 10, it being understood that any of the code vectors $V_1$–$V_4$ could be negative instead of positive. These four code vectors have tapered magnitudes such that the code vector $V_4$ has the largest power when transmitted, the code vector $V_3$ has the next largest power when transmitted, the code vector $V_2$ has the next largest power when transmitted, and the code vector $V_1$ has the smallest power when transmitted. By transmitting a code vector with a power that is greater than the power used to transmit the other code vectors, the likelihood of decoding the code vector transmitted with the greatest power is enhanced because this code vector has a power greater than the cross talk power contributed by the other code vectors.

The signal including these four substantially simultaneously transmitted code vectors is supplied to the multipliers $84_1, 84_2 \ldots 84_n$ which multiply the received signal by the coset leader$_1$, the coset leader$_2$, . . . the coset leader$_n$. The results of these multiplications are supplied to the corresponding Walsh transforms $86_1, 86_2 \ldots 86_n$ shown in FIG. 8. In this example, however, Walsh transform spectra $S_{11}, S_{12} \ldots S_{1n}$ produced by the arrangement 80 may have the appearance shown in FIG. 11. The Walsh transform spectra $S_{11}, S_{12} \ldots S_{1n}$ is different than the Walsh transform spectra $S_1, S_2 \ldots S_n$ shown in FIG. 9, primarily because the Walsh transform spectra $S_{11}, S_{12} \ldots S_{1n}$ contain more code vectors and because of the cross talk between these plural code vectors.

However, even though there is cross talk between these code vectors, there is a greater confidence that the coefficient in the Walsh transform spectra $S_{11}, S_{12} \ldots S_{1n}$ having the largest magnitude corresponds to the code vector $V_4$ shown in FIG. 10. That is, by tapering the powers of the code vectors as shown in FIG. 10, the confidence that a particular code vector, such as the code vector having the largest power, can be properly decoded is increased. Accordingly, the Walsh transform spectra $S_{11}, S_{12} \ldots S_{1n}$ are inspected in order to determine the coefficient having the largest magnitude. This coefficient designates the code vector $V_4$, which is the transmitted code vector having the largest power.

Figure 12:
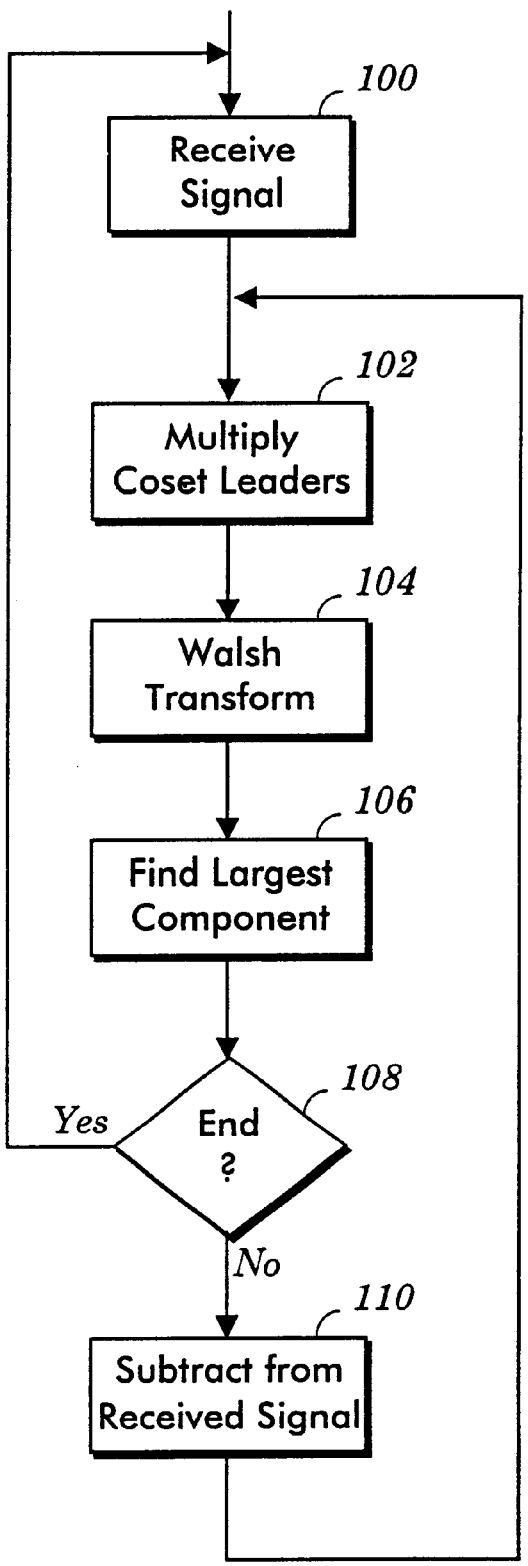
FIG. 12 illustrates a flow chart which may be implemented in accordance with one embodiment of the present invention in order to decode the code vectors illustrated in FIG. 10.

When code vectors are transmitted having tapered powers as shown in FIG. 10, the decoder 68 may be arranged to operate in accordance with the flow chart shown in FIG. 12. When the received signal containing the transmitted code vectors is received at a block 100, the received signal is multiplied by the coset leaders at a block 102, and Walsh transforms are performed on the multiplication results at a block 104. The coefficient having the largest magnitude is found at a block 106. The block 106 also recovers the data elements from this coefficient, as discussed above.

If all code vectors have not been decoded as determined at a block 108, the code vector corresponding to the coefficient having the largest magnitude (e.g., the code vector $V_4$) is then subtracted from the received signal at a block 110. The block 110 may determine the code vector producing the coefficient having the largest magnitude by (i) multiplying (a) the coset leader of the coset corresponding to the Walsh spectrum containing the largest coefficient and (b) the Walsh function defined by the recovered data, and (ii) complementing or not complementing the result depending upon whether the largest coefficient is negative or positive. The result is weighted by the weight that was applied to the fourth code vector $V_4$, and the weighted code vector $V_4$ is subtracted from the received signal in order to eliminate any cross talk contributed by the code vector $V_4$.

Thereafter, the processing of the blocks 102, 104, 106, 108, and 110 is repeated until all data elements are recovered from code vectors $V_3$, $V_2$, and $V_1$, at which point processing returns to the block 100. The flow chart of FIG. 12 may be implemented in either software or hardware.

It should be noted that the tapered approach discussed above requires greater power than is required when fewer code vectors are transmitted with equal power because the power of the smallest transmitted code vector must still be greater than noise in order for the smallest transmitted code vector to be discernible from that noise, and because the remaining code vectors must have ever greater powers so that the code vectors are tapered. However, the total power required to transmit these tapered vectors may be reduced by the windowing embodiment discussed below.

In this windowing embodiment (which may alternatively be referred as group decoding), the transmitted code vectors are tapered, but the tapering may be less than must be the case where windowing is not used. As in the case discussed above, let it be assumed that four transmitted code vectors $V_1$, $V_2$, $V_3$, and $V_4$ are to be transmitted at a time. These code vectors are tapered so that the code vector $V_4$ has the largest power, so that the code vector $V_3$ has the next largest power, so that the code vector $V_2$ has the next largest power, and so that the code vector $V_1$ has the smallest power. It may be further assumed that the these four code vectors are selected from $coset_1$, $coset_2$, . . . $coset_8$ so that the code vector $V_1$ is selected from either $coset_1$ or $coset_2$, so that the code vector $V_2$ is selected from either $coset_3$ or $coset_4$, so that the code vector $V_3$ is selected from either $coset_5$ or $coset_6$, and so that the code vector $V_4$ is selected from either $coset_7$ or $coset_8$.

With these assumptions, the decoder 68 may be arranged to perform a group of Walsh transforms (i.e., less than all) in accordance with the arrangement 80 on a received signal so as to produce a corresponding group of Walsh transform spectra defined. This group of Walsh transforms may be envisioned as being within a window. The window, in effect, determines (i) the coset leaders that are multiplied against the received signal and (ii) the Walsh transform spectra that are produced from the multiplication results. For example, if n=8 in FIG. 8, the window may be arranged so that the received signal is multiplied by $coset\ leader_5$ through $coset\ leader_8$ and so that Walsh transforms $86_5$–$86_8$ are performed.

The decoder 68 then investigates the resulting Walsh transform spectra $S_{25}$–$S_{28}$ (FIG. 13) for the coefficient having the largest magnitude in these spectra. In effect, the window is established with respect to the code vectors $V_3$–$V_4$. This window reduces the probability that another code vector, such as the code vector $V_1$ or the code vector $V_2$, will be improperly decoded as the code vector $V_4$ should the code vector $V_1$ or the code vector $V_2$, because of cross talk, produce a coefficient in the Walsh transform spectra $S_{21}$–$S_{24}$ that is larger than the coefficient produced by the code vector $V_4$. Also, this windowing embodiment reduces the amount of processing required to decode a code vector because, in the above example, only the processing of multipliers $84_5$–$84_8$ and of Walsh transforms $86_5$–$86_8$ is performed in order to decode the code vector $V_4$. Once the window is established, the code vector corresponding to the largest coefficient in the window is decoded to its data elements, and the decoded code vector is subtracted from the received signal in order to eliminate its cross talk from the received signal.

In the example, the window is then moved (slid) down to encompass a new group of multipliers and Walsh transforms. Thus, in the example, the received signal is multiplied by $coset\ leader_3$ through $coset\ leader_6$ and to accordingly perform Walsh transforms $86_3$–$86_6$. The decoder 68 then investigates the Walsh transform spectra $S_{23}$–$S_{26}$ for the coefficient having the largest magnitude in these spectra. In effect, a window is established with respect to the code vectors $V_2$–$V_3$. The code vector corresponding to the largest coefficient in the window is decoded to its data elements, the decoded code vector is subtracted from the received signal in order to eliminate its cross talk from the received signal, and the window is slid again and the process is repeated.

Figure 14:
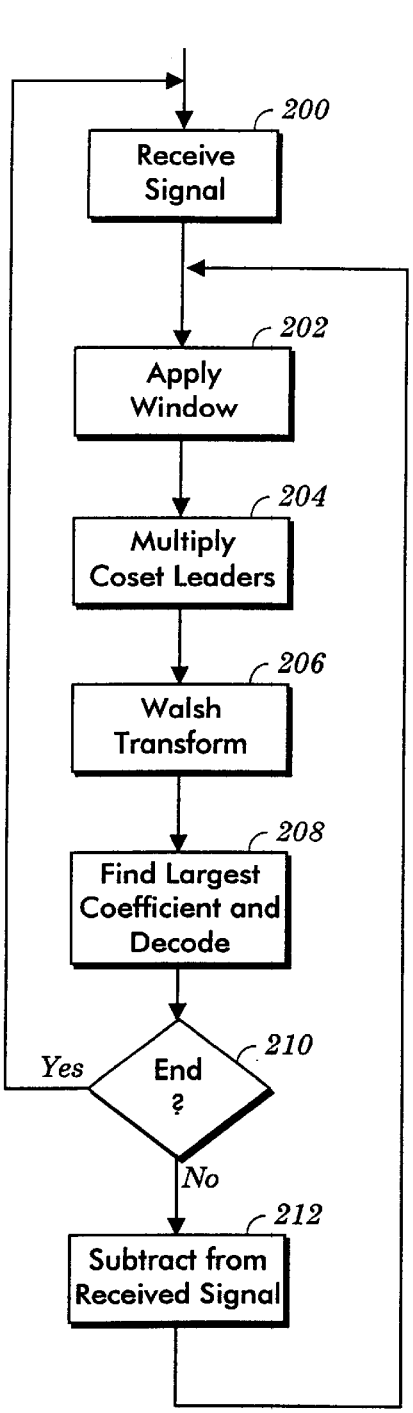
FIG. 14 illustrates a flow chart which may be implemented in accordance with another embodiment of the present invention in order to decode code vectors.

When code vectors are transmitted having varying powers, and when a sliding window is used as described, the decoder 68 may be arranged to operate in accordance with the flow chart shown in FIG. 14. When the received signal containing the transmitted code vectors is received at a block 200, the window, as described above, is applied at a block 202, the received signal is multiplied by the coset leaders within the window at a block 204, and the appropriate Walsh transforms within the window are performed on the multiplication results at a block 206. In the example, the window is applied at the block 202 so that the received signal is multiplied by $coset\ leader_5$ through $coset\ leader_8$ at the block 204 and so that Walsh transforms $86_5$–$86_8$ are performed at the block 206. The largest coefficient of the Walsh transforms performed at the block 206 is found at a block 208.

The block 208 also recovers the data elements from this coefficient, as discussed above.

If all code vectors have not been decoded as determined at a block 210, the code vector decoded at the block 208 is subtracted from the received signal at a block 212. That is, the block 212 determines the decoded code vector by (i) multiplying the coset leader of the coset corresponding to the Walsh spectrum containing the largest coefficient within the window and the Walsh function defined by the recovered data, and (ii) complementing or not complementing the result depending upon whether the largest coefficient within the window is negative or positive. (Alternatively, the recovered data elements could be used as an address into a lookup table in order to read out the corresponding code vector.) This decoded code vector is weighted by the weight that was applied to it, and the weighted code vector is subtracted from the received signal in order to eliminate any cross talk contributed by this code vector.

Thereafter, the processing of the blocks 202, 204, 206, 208, 210, and 212 is repeated. In this case, the window is applied so that it covers cosets $S_{23}$–$S_{26}$. When all data elements are recovered from the code vectors $V_4$, $V_3$, $V_2$, and $V_1$, processing returns to the block 200. It should be noted that the flow chart of FIG. 14 may be implemented in either software or hardware.

When two or more code vectors are simultaneously transmitted with tapered powers, the Walsh transform coefficients associated with the two largest code vectors may have approximately the same magnitude, so that neither can be decoded with confidence. In order to avoid this possibility, a two-pass embodiment of the invention may be implemented. Although the two-pass embodiment may be used with or without a window, the two-pass embodiment is described here as a feature of the windowing embodiment.

In this modified windowing embodiment, the two code vectors associated with the nearly equal coefficients are temporarily decoded and are subtracted, during a first pass, from the received signal at half of their full transmitted strength. Thus, this two-pass feature assumes a window wider than two code vectors. The Walsh transform of the subtraction result as defined by the window is then performed during a second pass. The resulting Walsh transform coefficient having the largest magnitude within the window is then presumably associated with the code vector which has the next largest transmitted power. This code vector is decoded and is subtracted from the received signal. Accordingly, the cross talk of the decoded code vector is eliminated from the received signal. By eliminating the cross talk of this code vector from the received signal, the two code vectors which previously produced equal coefficients will now probably produce significantly different coefficient magnitudes when the Walsh transform of the remaining received signal is performed during the second pass. In the practical case where more than four code vectors are transmitted at a time, the window need not be slid or otherwise adjusted for this second pass, and need only be slid when the code vector within the window having the largest transmitted strength is decoded.

For example, if sixteen code vectors (i.e., code vectors $V_1$–$V_{16}$) are transmitted at a time, the window size may be chosen to encompass a predetermined number greater than two (such as four) of Walsh transform spectra. The decoder 68 may be configured so that Walsh transforms defined by the window are performed on the received signal during the first pass and the resulting Walsh transform spectra are investigated for the coefficient having the largest magnitude.

If the two largest coefficients in these Walsh transform spectra are about equal in magnitude, the code vectors corresponding to these two largest coefficients are subtracted as described above and a second pass is performed. During this second pass, the Walsh transforms defined by the window are performed on the subtraction result, and the resulting Walsh transform spectra are investigated for the coefficient having the largest magnitude. The code vector corresponding to this coefficient is decoded, and this code vector is subtracted from the received signal in order to eliminate its cross talk contribution from the received signal.

The Walsh transform of the remaining received signal is then performed and the Walsh transform spectra defined by the window are investigated for the coefficient having the largest magnitude. The code vector corresponding to this coefficient is decoded, and this code vector is subtracted from the received signal in order to eliminate its cross talk contribution from the received signal. Assuming that the code vector having the greatest transmitted power is decoded during this second pass, the window is then slid and the remaining transmitted code vectors are decoded in like manner.

Figure 15:
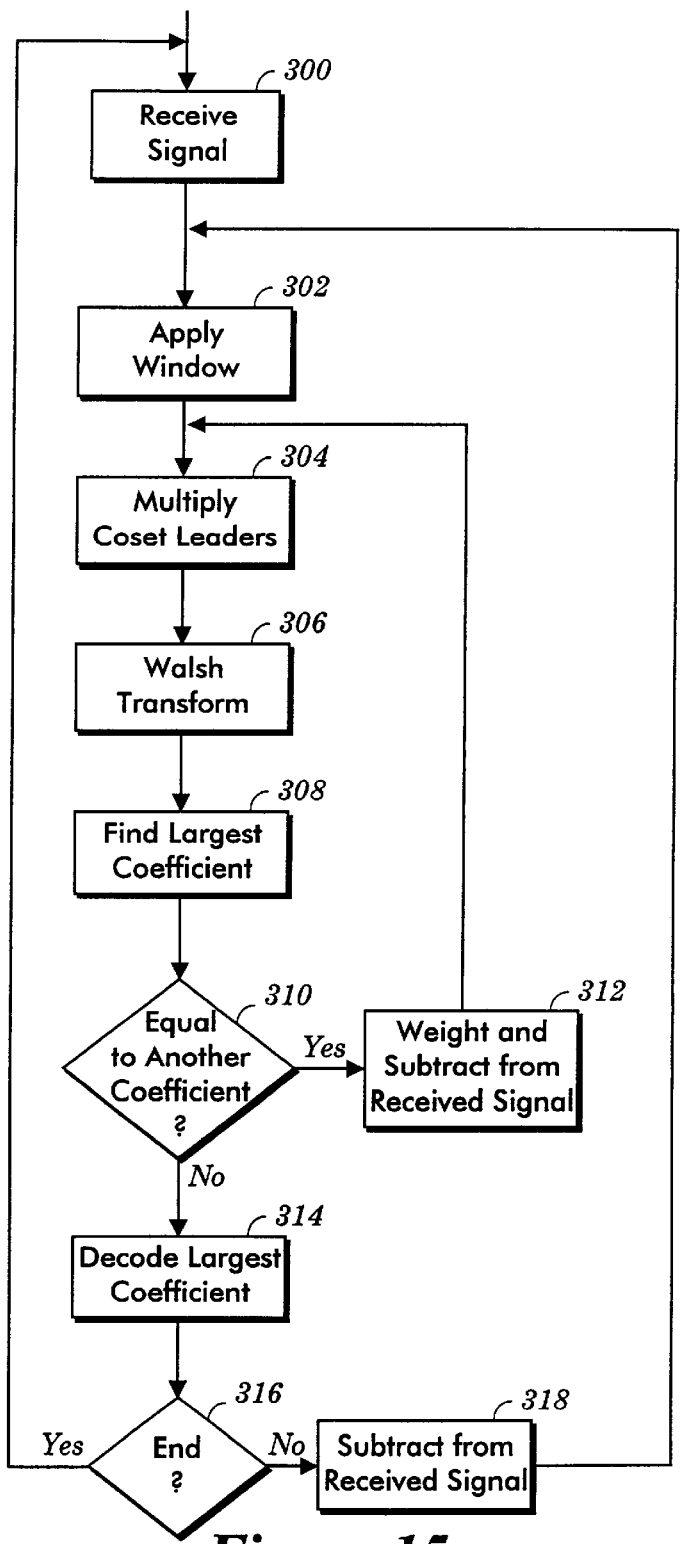
FIG. 15 illustrates a flow chart which may be implemented in accordance with still another embodiment of the present invention in order to decode code vectors; and, FIG. 16 illustrates a flow chart which may be implemented in accordance with a further embodiment of the present invention in order to decode code vectors.

When code vectors are transmitted having varying powers and when a two pass sliding window is used as described above, the decoder 68 may be arranged to operate in accordance with the flow chart shown in FIG. 15. When the received signal containing the transmitted code vectors is received at a block 300, the window as described above is applied at a block 302, the received signal is multiplied by the coset leaders defined by this window at a block 304, and Walsh transforms defined by this window are performed on the multiplication results at a block 306. The coefficient having the largest magnitude is found at a block 308. If there are two coefficients which have the largest magnitude, as determined at a block 310, the two code vectors corresponding to these two coefficients are decoded and are subtracted from the received signal at a block 312. (If the window has sufficient size, and if there are three coefficients having the largest magnitude as determined by a block 310, the three code vectors corresponding to these three coefficients are subtracted from the received signal at a block 312.)

At the block 304, the resulting signal is multiplied by the coset leaders as defined by the window, and Walsh transforms defined by this window are again performed on the multiplication results at a block 306. The coefficient having the largest magnitude is found at the block 308. If this coefficient has the largest magnitude as determined by the block 310, the corresponding data elements are recovered from this coefficient at the block 314, as discussed above.

If all code vectors have not been decoded as determined at a block 316, the code vector decoded at the block 314 is subtracted from the received signal at a block 318. The result is weighted by the weight that was applied to the decoded code vector, and the weighted decoded code vector is subtracted from the received signal in order to eliminate any cross talk it contributed.

Thereafter, the processing of the blocks 302, 304, 306, 308, 310, 312, 314, 316, and 318 is repeated. In the case where the loop including the block 312 was performed, the window is not moved during the next pass through the blocks 302, 304, 306, 308, 310, 312, 314, 316, and 318. However, in the case where the loop including the block 312 was not performed, the window is moved, as described above, during the next pass through the blocks 302, 304, 306, 308, 310, 312, 314, 316, and 318. It should be noted that the flow chart of FIG. 15 may be implemented in either software or hardware.

A reliability factor embodiment of decoding simultaneously transmitted code vectors may be implemented in order to determine which of the code vectors may be most reliably decoded. This reliability factor embodiment may be used alone or in combination with the windowing embodiment and/or the two-pass embodiment.

In a simple example where two code vectors are simultaneously transmitted, and where each of the possible code vectors has a length of sixteen, the 256 possible code vectors may be divided into the eight cosets discussed above. These cosets may be divided into two groups of four cosets each such that one of the transmitted code vectors is from one of the groups, and the other transmitted code vector is from the other group. In this example, the arrangement 80 shown in FIG. 8 produces two groups of Walsh transform spectra, with four Walsh transform spectra per group.

Figure 13:
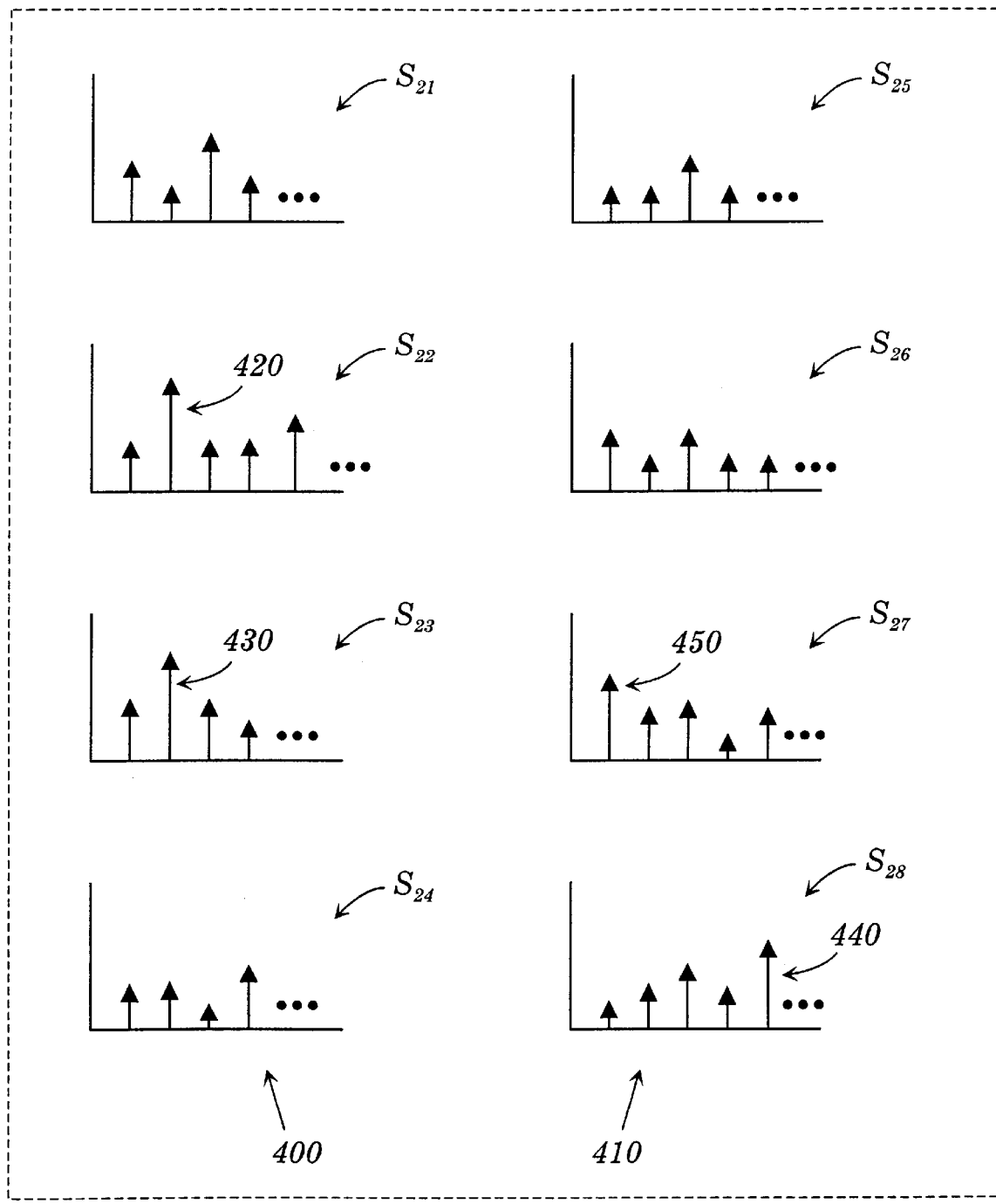
FIG. 13 illustrates an alternative set of Walsh transform spectra which are determined by the Walsh transform of FIG. 8 and which correspond to code vectors which are combined and transmitted by the transmitter illustrated in FIG. 4.

Based upon this simple example, the two groups of Walsh transform spectra produced by the arrangement 80 may have the appearance of Walsh transform spectra groups 400 and 410 shown in FIG. 13. The Walsh transform spectra group 400 includes Walsh transform spectra $S_{21}$, $S_{22}$, $S_{23}$, and $S_{24}$ corresponding to four of the eight possible cosets. The Walsh transform spectra group 410 includes the Walsh transform spectra $S_{25}$, $S_{26}$, $S_{27}$, and $S_{28}$ corresponding to the other four of the eight possible cosets.

The Walsh transform spectra $S_{22}$ of the Walsh transform spectra group 400 includes a coefficient 420 which may have the largest magnitude of any of the coefficients in the Walsh transform spectra group 400. The Walsh transform spectra $S_{23}$ of the Walsh transform spectra group 400 includes a coefficient 430 which may have the next largest magnitude of any of the coefficients in the Walsh transform spectra group 400. A first reliability factor $\Delta_1$ may be determined as the difference between the coefficients 420 and 430. The magnitude of the reliability factor $\Delta_1$ is a measure of confidence that the coefficient 420 corresponds to one of the two transmitted code vectors.

Similarly, the Walsh transform spectra $S_{28}$ of the Walsh transform spectra group 410 includes a coefficient 440 which may have the largest magnitude of any of the coefficients in the Walsh transform group 410. The Walsh transform spectra $S_{27}$ of the Walsh transform spectra group 410 includes a coefficient 450 which may have the next largest magnitude of any of the coefficients in the Walsh transform spectra group 410. A second reliability factor $\Delta_2$ may be determined as the difference between the coefficients 440 and 450. The magnitude of the reliability factor $\Delta_2$ is a measure of confidence that the coefficient 440 corresponds to the other of the two transmitted code vectors.

The decoder 68 then selects the larger of the first and second reliability factors $\Delta_1$ or $\Delta_2$ in order to decode one of the transmitted code vectors. The largest reliability factor $\Delta_1$ or $\Delta_2$ is selected because the greatest confidence of a correct code vector determination is associated with the greatest coefficient difference between the largest coefficient in a group and the next larger coefficient in the same group. Accordingly, the decoder 68 determines one of transmitted code vectors as one corresponding to the larger of the two coefficients producing the largest coefficient difference.

Thus, for example, if the reliability factor $\Delta_2$ is larger than the reliability factor $\Delta_1$, a transmitted code vector is determined from the coefficient 440, which is the larger of the coefficients 440 and 450. The data elements are recovered from this larger coefficient as discussed above, and the corresponding code vector is subtracted from the received signal. Thereafter, the process discussed above, including performing a Walsh transform on the subtraction results, determining the coefficient differences between the largest coefficient and the next largest coefficient in each group, and determining a transmitted code vector corresponding to the larger coefficient associated with the largest coefficient difference, is repeated.

Figure 16:
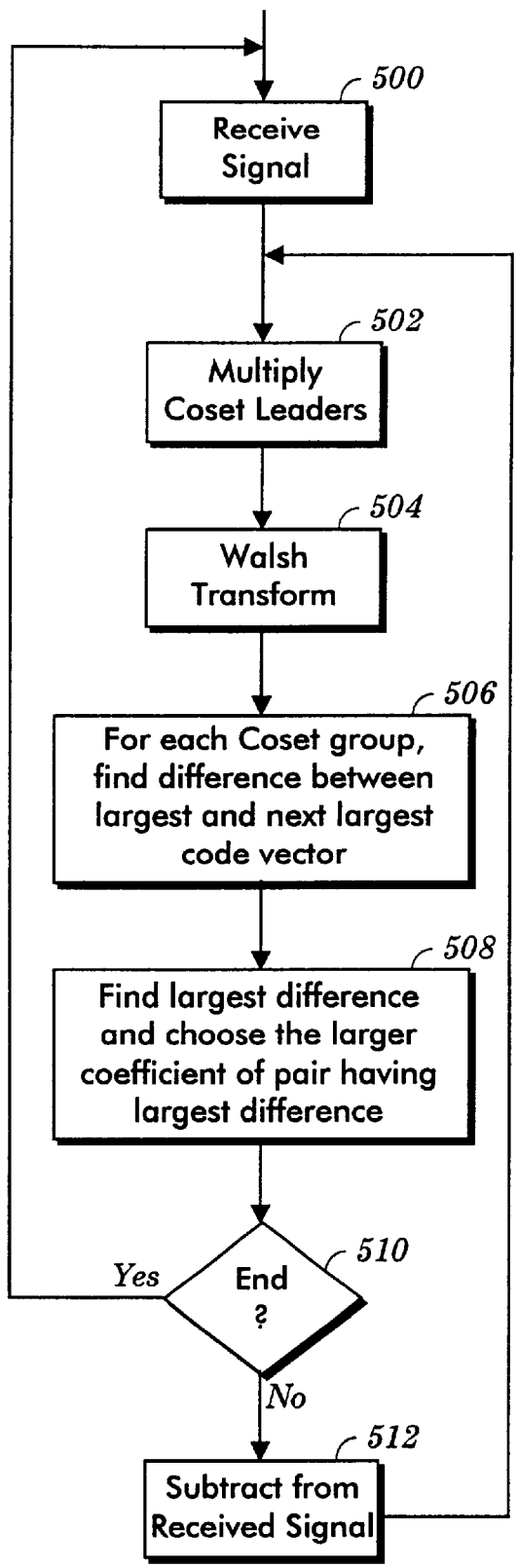

This decoding process, generalized to any number of simultaneously transmitted code vectors, is embodied in the flow chart shown in FIG. 16. As shown in FIG. 16, the decoder 68 receives the received signal at a block 500 and multiplies the received signal by the coset leaders at a block 502. The Walsh transform of the multiplication results is performed at a block 504 to produce Walsh transform spectra for each group of cosets, where the number of groups of cosets is determined, at least in part, by the number and length of code vectors that are transmitted at a time.

At a block 506, a reliability factor $\Delta$ is determined as the difference between the coefficient having the largest magnitude and the coefficient having the next largest magnitude for each coset group. The largest reliability factor $\Delta$ is found at a block 508 because confidence in a correct code vector determination is greatest when a code vector is determined from the larger coefficient of the two coefficients producing the largest reliability factor $\Delta$. Accordingly, the data elements corresponding to this code vector are determined, as before, at the block 508.

If all of the code vectors have not been found as determined at a block 510, the last found code vector is determined and is subtracted from the received signal at a block 512, and the functions of the blocks 502–512 are repeated with respect to the subtraction results. When all of the code vectors have been found as determined by the block 510, flow returns to the block 500 to await another receiver signal. It should be noted that the flow chart of FIG. 16 may be implemented in either software or hardware.

As discussed above, the system rate can be increased by increasing the number of code vectors transmitted simultaneously. The number of code vectors simultaneously transmitted can be increased by increasing the length of the code vector. As the length of the code vector increases, it may be necessary to also increase the number of cosets and/or groups of cosets. As the number of code vectors that are simultaneously transmitted is increased by increasing the code vector length, the computational expense of decoding these code vectors increases. However, while the computational expense necessary to decode code vectors having larger lengths increases, this computational expense increases approximately linearly with the length of the code vector. On the other hand, the code gain realized by transmitting plural code vectors together increases approximately exponentially with the length of the code vector. Therefore, while coset size and other considerations place practical limits on computational expense, length should be maximized within these constraints in order to realize as much gain as possible.

Certain modifications of the present invention have been discussed above. Other modifications will occur to those practicing in the art of the present invention. For example, according to the description above, a Walsh transform is used to determine a transmitted code vector, However, other transforms may be used to determine the transmitted code vectors.

Also, the head end transmitter 50, the receiver 60, and the arrangement 80 are shown as comprising various blocks. Each of these blocks may be implemented as one or more discrete components, one or more integrated circuits, one or more programmable logic circuits or arrays, software, and/or the like.

In addition, the head end transmitter 50 is disclosed above as including elements such as the data source 52, the Reed Solomon forward error correction circuit 54, the encoder 56, and a modulator/transmitter 58, and the receiver 60 is disclosed above as including elements such as a tuner 62, an equalizer 64, a demodulator 66, a decoder 68, and a Reed Solomon forward error correction circuit 70. However, the head end transmitter 50 and the receiver 60 may include elements different than, or in addition to, these disclosed elements.

Moreover, various embodiments have been described above. The features of these embodiments may be mixed as desired in yet other embodiments of the present invention. For example, the reliability feature of the embodiment disclosed in connection with FIG. 16 may be used in combination with tapered code vectors, and the windowing embodiment disclosed in connection with FIG. 14 may be used in combination with non-tapered code vectors.

Furthermore, as described above, the decoder 68 produces Walsh transform spectra defined by a window such that the window determines (i) the coset leaders that are multiplied against the received signal, and (ii) the Walsh transform spectra that are produced from the multiplication results. Alternatively, the decoder 68 may be arranged to produce Walsh transform spectra without a window such that all coset leaders are multiplied by the received signal. In this event, however, a window might be applied to the resulting Walsh transform spectra to reduce the possibility that a code vector corresponding to a coefficient within the window is decoded as a code vector corresponding to a coefficient outside the window.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A method comprising the following steps:
   a) receiving a signal, wherein the received signal contains a plurality of transmitted code vectors, and wherein the plurality of transmitted code vectors are members of a predetermined set of code vectors;
   b) producing a received signal transform of the received signal, wherein the received signal transform contains a coefficient for each of at least some of the code vectors of the predetermined set of code vectors, wherein each coefficient of the received signal transform has a magnitude, and wherein the magnitude of one of the coefficients of the received signal transform is largest;
   c) determining data elements corresponding to one of the plurality of transmitted code vectors from the coefficient of the received signal transform having the largest magnitude;
   d) subtracting the one transmitted code vector from the received signal to produce a subtraction result;
   e) producing a subtraction result transform of the subtraction result, wherein the subtraction result transform contains a coefficient for each of at least some of the code vectors of the predetermined set of code vectors, wherein each coefficient of the subtraction result transform has a magnitude, and wherein the magnitude of one of the coefficients of the subtraction result transform is largest; and, f) determining data elements corresponding to another one of the plurality of transmitted code vectors from the coefficient of the subtraction result transform having the largest magnitude.

2. The method of claim 1 wherein each of the plurality of transmitted code vectors corresponds to a coset of code vectors, wherein step b) comprises the step of multiplying the received signal by a plurality of coset leaders in order to produce a received signal transform spectrum of coefficients for at least some of the cosets, wherein each coset leader corresponds to a coset, and wherein step e) comprises the step of multiplying the subtraction result by the plurality of coset leaders in order to produce a subtraction result transform spectrum of coefficients for at least some of the cosets.

3. The method of claim 2 wherein the transmitted code vectors have tapered transmitted strengths.

4. The method of claim 3 wherein step b) comprises the steps of applying a window to the received signal, and producing a received signal transform confined to the window.

5. The method of claim 4 wherein step c) comprises the further following step:
if at least two coefficients within the window are largest in magnitude and have substantially equal magnitudes, subtracting code vectors corresponding to the at least two coefficients from the received signal to produce a subtraction result, and determining data elements corresponding to a coefficient produced from the subtraction result.

6. The method of claim 2 wherein step b) comprises the steps of applying a window to the received signal transform, and producing a received signal transform confined to the window.

7. The method of claim 6 wherein step c) comprises the further following step:
if at least two coefficients within the window are largest in magnitude and have substantially equal magnitudes, subtracting code vectors corresponding to the at least two coefficients from the received signal to produce a subtraction result and determining data elements corresponding to a coefficient produced from the subtraction result.

8. The method of claim 2 wherein the cosets are divided into groups of cosets, wherein step b) comprises the step of producing a coefficient spectrum for each of the cosets in at least some of the groups of cosets based upon the received signal, and wherein step c) comprises the step of determining data elements corresponding to the one transmitted code vector based upon the magnitudes of the coefficients.

9. The method of claim 8 wherein step c) comprises the steps of determining, for each of the least some of the groups of cosets, a difference in magnitude between the coefficient having the largest magnitude and the coefficient having the next largest magnitude, determining which difference is largest, and determining data elements corresponding to the one transmitted code vector from the larger coefficient of the coefficients producing the largest coefficient difference.

10. The method of claim 1 wherein the code vectors of the plurality code vectors are divided into cosets, wherein the data elements include a first group of data elements corresponding to a coset containing the one transmitted code vector, a second group of data elements corresponding to the one transmitted code vector within its coset, a third group of data elements corresponding to a polarity of the one transmitted code vector, a fourth group of data elements corresponding to a coset containing the other transmitted code vector, a fifth group of data elements corresponding to the other transmitted code vector within its coset, and a sixth group of data elements corresponding to a polarity of the other transmitted code vector.

11. The method of claim 1 wherein step c) comprises the further following step:
if at least two coefficients within the window are largest in magnitude and have substantially equal magnitudes, subtracting code vectors corresponding to the at least two coefficients from the received signal to produce a subtraction result, and determining data elements corresponding to a coefficient produced from the subtraction result.

12. A method comprising the following steps:
a) receiving a signal, wherein the received signal contains a plurality of code vectors, wherein the plurality of code vectors are members of a predetermined set of code vectors, wherein the code vectors in the predetermined set of code vectors are divided into cosets, wherein the cosets are arranged into groups of cosets, and wherein each code vector contained in the received signal belongs to a corresponding group of cosets;

b) applying a window to a first subset of the cosets;

c) multiplying the received signal by a coset leader corresponding to each coset within the window in order to produce a received signal coefficient spectrum for each coset within the window, wherein each received signal coefficient spectrum contains received signal coefficients for at least some of the code vectors of a corresponding coset, and wherein each received signal coefficient of each received signal coefficient spectrum has a magnitude;

d) determining data elements from one of the received signal coefficients that corresponds to a coset within the window and that has the largest magnitude;

e) subtracting a code vector corresponding to the data elements determined in step d) from the received signal to produce a subtraction result;

f) sliding the window to cover a second subset of the cosets;

g) multiplying the subtraction result by the coset leaders corresponding to the cosets within the window in order to produce a subtraction result coefficient spectrum for each coset within the window, wherein each subtraction result coefficient spectrum contains subtraction result coefficients for at least some of the code vectors of a corresponding coset, and wherein each subtraction result coefficient of each subtraction result coefficient spectrum has a magnitude; and, h) determining data elements corresponding to a code vector from one of the subtraction result coefficients that corresponds to a coset within the window and that has the largest magnitude.

13. The method of claim 12 wherein the code vectors in the received signal have tapered transmitted magnitudes.

14. The method of claim 12 wherein step d) comprises the further following steps:
if at least two coefficients within the window are largest in magnitude and have substantially equal magnitudes, subtracting code vectors corresponding to the at least two coefficients from the received signal to produce a subtraction result, and determining data elements corresponding to a coefficient produced from the subtraction result.

15. The method of claim 12 wherein the code vectors of the plurality code vectors are divided into cosets, wherein the data elements include a first group of data elements corresponding to a coset containing a first transmitted code vector, a second group of data elements corresponding to the first transmitted code vector within its coset, a third group of data elements corresponding to a polarity of the first transmitted code vector, a fourth group of data elements corresponding to a coset containing a second transmitted code vector, a fifth group of data elements corresponding to the second transmitted code vector within its coset, and a sixth group of data elements corresponding to a polarity of the second transmitted code vector.

16. The method of claim 12 wherein step c) comprises the following steps:

determining, for each group of cosets, a difference in magnitude between the coefficient having the largest magnitude and the coefficient having the next largest magnitude;

determining which difference is largest; and, determining data elements corresponding to the one of the code vectors contained in the received signal from the larger coefficient of the coefficients producing the largest coefficient difference.

17. A method comprising the following steps:

receiving a signal, wherein the received signal contains simultaneously transmitted first and second code vectors, and wherein the first and second code vectors are members of a predetermined set of code vectors;

producing a received signal transform of the received signal, wherein the received signal transform contains a coefficient for each of at least some of the code vectors of the predetermined set of code vectors, and wherein each coefficient has a magnitude;

deriving a first reliability factor $\Delta_1$ indicating confidence in correctly decoding the first code vector;

deriving a second reliability factor $\Delta$hd 2indicating confidence in correctly decoding the second code vector;

decoding the first code vector before the second code vector if the first reliability factor $\Delta_1$ is larger than the second reliability factor $\Delta_2$; and, decoding the second code vector before the first code vector if the second reliability factor $\Delta_2$ is larger than the first reliability factor $\Delta_1$.

18. A receiver that receives a signal containing at least one code vector of a first set of code vectors, the receiver comprising;

a multiplier that multiplies the received signal by a second set of code vectors to produce a plurality of corresponding multiplication results, wherein the code vectors in the second set of code vectors are data dependent code vectors and are members of the first set of code vectors, wherein there are fewer code vectors in the second set of code vectors than in the first set of code vectors, and wherein at least some of the code vectors in the second set are coset leaders;

a transform that transforms the multiplication results into a plurality of multi-coefficient spectra; and, a decoder that recovers data elements corresponding to the code vector contained in the received signal from the plurality of multi-coefficient spectra.

19. The receiver of claim 18 wherein the transform performs a Walsh transform.

20. The receiver of claim 18 wherein the code vectors of the first set of code vectors are divided into cosets, and wherein the multiplier multiplies the received signal by a coset leader uniquely corresponding to each coset.

21. The receiver of claim 18 wherein the decoder recovers the data elements corresponding to the received code vector based upon a coefficient of the multi-coefficient spectra whose magnitude is largest.

22. The receiver of claim 21 wherein the code vectors of the first set of code vectors are divided into cosets, and wherein the multiplier multiplies the received signal by a coset leader uniquely corresponding to each coset.

23. The receiver of claim 18 wherein the code vectors of the first set of code vectors are Kerdock code vectors.

24. The receiver of claim 23 wherein the transform performs a Walsh transform.

25. The receiver of claim 23 wherein the Kerdock code vectors are divided into cosets, and wherein the multiplier multiplies the received signal by a coset leader uniquely corresponding to each coset.

26. The receiver of claim 23 wherein the decoder recovers data elements corresponding to the received Kerdock code vector based upon the coefficient of the multi-coefficient spectra whose magnitude is largest.

27. The receiver of claim 26 wherein the Kerdock code vectors are divided into cosets, and wherein the multiplier multiplies the received signal by a coset leader uniquely corresponding to each coset.

28. The receiver of claim 18 wherein the code vectors of the first set of code vectors are divided into cosets, wherein the data elements include a first group of data elements corresponding to a coset containing the received code vector, a second group of data elements corresponding to the received code vector within its coset, and a third group of data elements corresponding to a polarity of the received code vector.

29. The receiver of claim 18 wherein the received signal contains at least first and second codes vectors, wherein the transform produces multi-coefficient spectra based upon the first and second code vectors, and wherein the decoder determines a reliability factor from the multi-coefficient spectra and decodes the first and second code vectors in an order dependent upon the reliability factor.

30. A system that receives a signal, wherein the received signal contains at least first and second code vectors, wherein the first and second code vectors are members of a predetermined set of code vectors, and wherein the system comprises:

a transform that produces a received signal transform of the received signal, wherein the received signal transform contains a coefficient for each of at least some of the code vectors of the predetermined set of code vectors, and wherein each coefficient has a magnitude; and, a decoder that decodes data elements corresponding to one of the received first and second code vectors based upon the magnitudes of the coefficients of the received signal transform, wherein the decoder subtracts the one of the first and second code vectors from the received signal to produce a subtraction result, and wherein the decoder decodes data elements corresponding to the other of the first and second code vectors from the subtraction result.

31. The system of claim 30 wherein the decoder supplies the subtraction result to the transform which produces a subtraction result transform of the subtraction result, wherein the subtraction result transform contains a coefficient for at least some of the code vectors of the predetermined set of code vectors, wherein each coefficient of the subtraction result transform has a magnitude, and wherein the decoder decodes data elements corresponding to the other of the first and second code vectors based upon the magnitudes of the coefficients of the subtraction result transform.

32. The system of claim 31 wherein the transform performs a Walsh transform.

33. The system of claim 31 wherein the code vectors in the predetermined set of code vectors are divided into cosets, wherein the transform comprises a multiplier that multiplies the received signal or the subtraction result, as appropriate, by a coset leader uniquely corresponding to each of the cosets, and wherein the transform produces a spectrum of coefficients for each of the cosets based upon results from the multiplier.

34. The system of claim 33 wherein the decoder decodes the data elements corresponding to the one of the first and second code vectors based upon a coefficient which is one of the coefficients of the received signal transform and which is largest, and wherein the decoder decodes the data elements corresponding to the other of the first and second code vectors based upon a coefficient which is one of the coefficients of the subtraction result transform and which is largest.

35. The system of claim 30 wherein the code vectors in the predetermined set of code vectors are divided into cosets, wherein the transform comprises a multiplier that multiplies the received signal by a coset leader uniquely corresponding to each of the cosets, and wherein the transform produces a spectrum of coefficients for each of the cosets based upon results from the multiplier.

36. The system of claim 35 wherein the decoder decodes the data elements corresponding to the one of the first and second code vectors based upon a coefficient which is largest.

37. The system of claim 30 wherein the decoder decodes the data elements corresponding to the one of the first and second code vectors based upon a coefficient of the received signal transform which is largest.

38. The system of claim 30 wherein the code vectors of the predetermined set of code vectors are Kerdock code vectors.

39. The system of claim 30 wherein the received signal contains a plurality of transmitted code vectors including the first and second code vectors, and wherein the plurality of transmitted code vectors are members of the predetermined set of code vectors.

40. The system of claim 39 wherein the transmitted code vectors have tapered transmitted magnitudes, wherein the decoder decodes data elements corresponding to one of the transmitted code vectors based upon a magnitude of one of the coefficients that is largest, wherein the decoder subtracts the determined one of the transmitted code vectors from the received signal to produce a subtraction result, wherein the transform produces a subtraction result transform of the subtraction result, wherein the subtraction result transform contains a subtraction result coefficient for each of at least some of the code vectors of the predetermined set of code vectors, and wherein the decoder decodes data elements corresponding to another of the transmitted code vectors based upon a magnitude of one of the subtraction result coefficients that is largest.

41. The system of claim 40 wherein each transmitted code vector is selected from a corresponding coset of code vectors, wherein the decoder applies a window to some of the cosets, and wherein the transform produces a coefficient spectrum for each of the cosets within the window.

42. The system of claim 41 wherein the decoder, if at least two coefficients within the window are largest in magnitude and have substantially equal magnitudes, subtracts code vectors corresponding to the at least two coefficients from the received signal to produce a subtraction result, and wherein the decoder decodes data elements from a coefficient of a transform spectrum within the window produced from the subtraction result.

43. The system of claim 42 wherein the subtracted code vectors are subtracted at substantially ½ of their transmitted magnitudes.

44. The system of claim 39 wherein each transmitted code vector is selected from a corresponding coset of code vectors, wherein the decoder applies a window to some of the cosets, and wherein the transform produces a coefficient spectrum for each of the cosets within the window.

45. The system of claim 44 wherein the decoder, if at least two coefficients within the window are largest in magnitude and have substantially equal magnitudes, subtracts code vectors corresponding to the at least two coefficients from the received signal to produce a subtraction result, and wherein the decoder decodes data elements from a coefficient of a transform spectrum within the window produced from the subtraction result.

46. The system of claim 45 wherein the subtracted code vectors are subtracted at substantially ½ of their transmitted magnitudes.

47. The system of claim 39 wherein the code vectors in the predetermined set of code vectors are divided into cosets, wherein the cosets are divided into groups of cosets, wherein the transform produces a coefficient spectrum for each of the cosets in at least some of the groups of cosets based upon the received signal, and wherein the decoder decodes data elements corresponding to one of the transmitted code vectors based upon the magnitudes of the coefficients.

48. The system of claim 47 wherein the decoder determines, for each of the at least some of the groups of cosets, a difference in magnitude between the coefficient having the largest magnitude and the coefficient having the next largest magnitude, wherein the decoder determines which difference is largest, and wherein the decoder decodes data elements corresponding to the one transmitted code vector from the larger coefficient of the coefficients producing the largest coefficient difference.

49. The system of claim 39 wherein the decoder, if at least two coefficients are largest in magnitude and have substantially equal magnitudes, subtracts code vectors corresponding to the at least two coefficients from the received signal to produce a subtraction result, and wherein the decoder decodes data elements from a coefficient of a transform spectrum produced from the subtraction result.

50. The system of claim 30 wherein the code vectors in the predetermined set of code vectors are divided into cosets, wherein the cosets are divided into groups of cosets, wherein the transform produces a coefficient spectrum for each of the cosets in at least some of the groups of cosets based upon the received signal, and wherein the decoder decodes data elements corresponding to one of the first and second code vectors based upon the magnitudes of the coefficients.

51. The system of claim 50 wherein the decoder determines, for each of the at least some of the groups of cosets, a difference in magnitude between the coefficient having the largest magnitude and the coefficient having the next largest magnitude, wherein the decoder determines which difference is largest, and wherein the decoder decodes data elements corresponding to the one of the first and second code vectors from the larger coefficient of the coefficients producing the largest coefficient difference.

52. The system of claim 30 wherein the code vectors of the plurality code vectors are divided into cosets, wherein the data elements include a first group of data elements corresponding to a coset containing the first code vector, a second group of data elements corresponding to the first code vector within its coset, a third group of data elements corresponding to a polarity of the first code vector, a fourth group of data elements corresponding to a coset containing the second code vector, a fifth group of data elements corresponding to the second code vector within its coset, and a sixth group of data elements corresponding to a polarity of the second code vector.

53. The system of claim 30 wherein the decoder determines a reliability factor from the coefficients and decodes the first and second code vectors in an order dependent upon the reliability factor.

54. A receiver that receives a signal containing at least one code vector of a first set of code vectors, wherein the first set of code vectors contains a plurality of code vectors, wherein at least some of the code vectors in the first set of code vectors are non-orthogonal to one another, the receiver comprising;
  a multiplier that multiplies the received signal by a second set of code vectors to produce a plurality of corresponding multiplication results, wherein the code vectors in the second set of code vectors are members of the first set of code vectors, wherein there are fewer code vectors in the second set of code vectors than in the first set of code vectors, and wherein at least some of the code vectors in the second set are coset leaders;
  a transform that transforms the multiplication results into a plurality of multi-coefficient spectra; and,
  a decoder that recovers data elements corresponding to the code vector contained in the received signal from the plurality of multi-coefficient spectra.

55. The receiver of claim 54 wherein the transform performs a Walsh transform.

56. The receiver of claim 54 wherein the code vectors of the plurality code vectors are divided into cosets, and wherein the multiplier multiplies the received signal by a coset leader uniquely corresponding to each coset.

57. The receiver of claim 54 wherein the decoder recovers the data elements corresponding to the received code vector based upon a coefficient of the multi-coefficient spectra whose magnitude is largest.

58. The receiver of claim 57 wherein the code vectors of the plurality code vectors are divided into cosets, and wherein the multiplier multiplies the received signal by a coset leader uniquely corresponding to each coset.

59. The receiver of claim 54 wherein the code vectors of the plurality of code vectors are Kerdock code vectors.

60. The receiver of claim 59 wherein the transform performs a Walsh transform.

61. The receiver of claim 59 wherein the Kerdock code vectors are divided into cosets, and wherein the multiplier multiplies the received signal by a coset leader uniquely corresponding to each coset.

62. The receiver of claim 59 wherein the decoder recovers data elements corresponding to the received Kerdock code vector based upon the coefficient of the multi-coefficient spectra whose magnitude is largest.

63. The receiver of claim 62 wherein the Kerdock code vectors are divided into cosets, and wherein the multiplier multiplies the received signal by a coset leader uniquely corresponding to each coset.

64. The receiver of claim 54 wherein the code vectors of the plurality code vectors are divided into cosets, wherein the data elements include a first group of data elements corresponding to a coset containing the received code vector, a second group of data elements corresponding to the received code vector within its coset, and a third group of data elements corresponding to a polarity of the received code vector.

65. The receiver of claim 54 wherein the received signal contains at least first and second codes vectors, wherein the transform produces multi-coefficient spectra based upon the first and second code vectors, and wherein the decoder determines a reliability factor from the multi-coefficient spectra and decodes the first and second code vectors in an order dependent upon the reliability factor.

66. A method of generating a reliability factor comprising:
  receiving a signal containing at least first and second code vectors;
  performing a transform on the signal to produce multi-coefficient spectra corresponding to the first and second code vectors, wherein the multi-coefficient spectra have peaks; and,
  generating a reliability factor based upon a difference between a peak corresponding to the first code vector and a peak corresponding to the second code vector.

67. The method of claim 66 wherein the peak corresponding to the first code vector is a largest peak corresponding to the first code vector, and wherein the peak corresponding to the second code vector is a largest peak corresponding to the second code vector.

* * * * *